Jan. 29, 1974 MASAYUKI YAMAMOTO ET AL 3,788,905

SEMICONDUCTOR DEVICE AND METHOD OF PRODUCING THE SAME

Original Filed Oct. 20, 1967 2 Sheets-Sheet 1

INVENTORS
MASAYUKI YAMAMOTO
KAZUO KOBAYASHI
YOSHITO OHASHI

BY Craig & Antonelli
ATTORNEYS

SEMICONDUCTOR DEVICE AND METHOD OF PRODUCING THE SAME

Original Filed Oct. 20, 1967 2 Sheets-Sheet 2

INVENTORS
MASAYUKI YAMAMOTO
KAZUO KOBAYASHI
YOUICHI OHASHI

BY Craig & Antonelli

ATTORNEYS

United States Patent Office 3,788,905

Patented Jan. 29, 1974

3,788,905

SEMICONDUCTOR DEVICE AND METHOD OF PRODUCING THE SAME

Masayuki Yamamoto, Kodaira, Kazuo Kobayashi, Tokyo, and Youitu Ohashi, Kodaira, Japan, assignors to Hitachi, Ltd., Tokyo, Japan Original application Oct. 20, 1967, Ser. No. 676,832. Divided and this application Nov. 28, 1969, Ser. No. 879,951

Claims priority, application Japan, Oct. 21, 1966, 41/68,886

Int. Cl. H01l 7/44

U.S. Cl. 148—187 3 Claims

ABSTRACT OF THE DISCLOSURE

A junction-type field effect transistor having a source region, a drain region and a carrier path region of n-type formed by diffusing an impurity from one principal surface of a p-type silicon substrate, a p-type gate region diffused between the source region and the drain region so as to define the carrier path region, and a high-doped $p^+$-type layer formed in the p-type silicon substrate surface directly beneath the silicon oxide film in order to eliminate the undesirable influence exerted by an inverted layer induced in the substrate surface by the oxide film. The high-doped $p^+$-type layer is continuous with the p-type gate region and is formed simultaneously with the gate region by a single diffusion treatment.

This is a division of application Ser. No. 676,832, filed Oct. 20, 1967, now abandoned.

BACKGROUND OF THE INVENTION

Field of the invention

This invention relates to a semiconductor device, and more particularly to an improved junction-type field effect transistor having a high input impedance, and a method for fabricating the same.

Description of the prior art

According to one of conventional techniques well known in the art, a field effect transistor is fabricated by the so-called double diffusion method. For example, an n-channel field effect transistor is produced in a manner as described below.

The prior method of producing such an n-channel field effect transistor comprises oxidizing the surface of a p-type silicon substrate having a relatively low impurity concentration to form an oxide film on the substrate surface, removing a portion of the oxide film to expose that portion of the substrate surface, then selectively diffusing an n-type impurity through the removed portion of the oxide film into the exposed portion to form an n-type layer in the substrate, and selectively diffusing a p-type impurity with a relatively high concentration into the n-type layer to form a p-type layer which is shallower in depth and smaller in area than the n-type layer. In the structure thus obtained, there are formed two n-type regions, that is, a source region and a drain region, which are disposed on opposite sides of the p-type region at the semiconductor substrate surface and are connected with each other in the semiconductor substrate by a thin n-type layer, that is, an n-type conductive channel which serves as a carrier path. Conductive layers are then ohmically attached onto the surfaces of the respective regions to provide a gate electrode, a drain electrode and a source electrode. In the semiconductor device, a voltage applied across the source electrode and the gate electrode acts to vary the spread of the depletion layer in the thin n-type layer, that is, the conductive channel for thereby controlling the current flowing through this conductive channel portion between the drain electrode and the source electrode. In the prior junction-type field effect transistor, however, a thin n-type layer (hereinafter to be referred to as an induced surface layer) is formed in the semiconductor substrate surface portion immediately beneath the oxide film during the formation of the oxide film on the substrate surface. The presence of such an induced surface layer is undesirable in that the reverse leakage current of the reverse-biased gate junction and/or the surface recombination current may be thereby increased to an extent that a reduction in the input and output impedance, breakdown of the gate junction, and lowering of the gate breakdown voltage are given rise to.

In the case of a bipolar pnp transistor, an attempt has priorly been made to provide an annular ring of a $p^+$-type diffused layer in the surface of the semiconductor substrate in such a manner that it surrounds the pn junction between the base and the collector in a suitably spaced relation from such pn junction in order to eliminate the leakage current which appears due to the presence of an n-type induced surface layer on the surface of the collector region. However, this method is defective in that an inverted layer extending over a considerable length from the junction portion to the annular ring is unavoidably formed, and as a result, the junction area becomes substantially larger than that of the true collector-base junction.

For the above reasons, the prior method as described above is not always suitable for the manufacture of a junction-type field effect transistor which is quite different from common transistors in view of its requirement for a high input and output impedance and a minimized reverse current at the gate junction.

SUMMARY OF THE INVENTION

The present invention contemplates to effect improvements in the structure of prior art in order to solve the above problems.

It is therefore the primary object of the present invention to provide a semiconductor device having improved electrical properties and a high reliability and a method of producing such a semiconductor device.

A more practical object of the present invention is to provide a junction-type field effect transistor having a minimized junction leakage current and a high input and a high output impedance characteristic and an improved method of readily producing such a field effect transistor.

According to one embodiment of the present invention, the marginal portion, which is exposed on the surface of a semiconductor substrate, of a pn junction formed between the semiconductor substrate and a semiconductor layer having a conduction type different from that of the semiconductor substrate is entirely covered with a high-doped layer having the same conductivity type as that of the semiconductor substrate so as to minimize the leakage current between the semiconductor regions, especially between the drain region and the source region, to reduce the gate leakage current, and to increase the input and the output impedance for thereby providing a stably operable and highly reliable field effect transistor.

DESCRIPTION OF THE PREFERRED EMBODIMENTS

A few embodiments of the present invention will now be described with reference to the drawings.

Figure 1A:
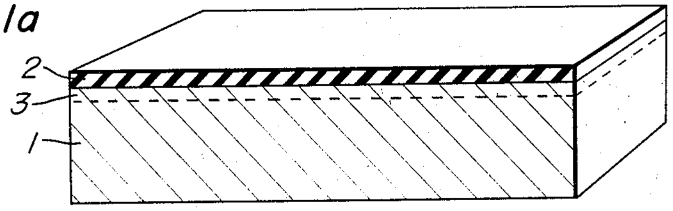
FIGS. 1*a* to 1*e* are partly sectional perspective views of a semiconductor element, illustrating successive steps for the manufacture of an embodiment of the junction-type field effect transistor according to the present invention.
Figure 1B:
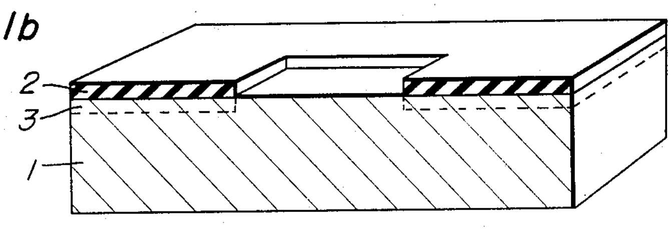
Figure 1C:
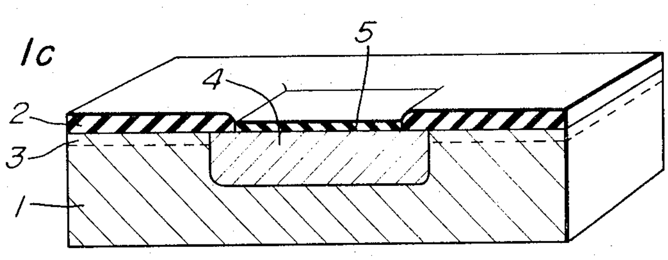

In one embodiment of the present invention, a semiconductor combination of the kind as shown in FIG. 1*a* is first prepared. The semiconductor combination comprises a p-type silicon substrate 1 having a resistivity of several Ω-cm., an electrically insulating film 2 such, for example, as an $SiO_2$ film about 5,000 A. thick covering one of the principal surfaces of the silicon substrate 1, and an n-type induced surface layer 3 induced in the substrate surface portion beneath the $SiO_2$ film 2 covering the principal surface of the substrate 1. Then as shown in FIG. 1*b*, a portion of the $SiO_2$ film 2 is removed to expose that portion of the surface of the substrate 1. A donor impurity such, for example, as antimony is diffused into the substrate 1 through the opening formed by the partial removal of the oxide film 2 to form an n-type diffused layer 4 in the substrate 1 as shown in FIG. 1*c*. The n-type diffused layer 4 has a surface impurity concentration in the order of $10^{16}$ atoms per cubic centimeter and a depth in the order of 1.5 to 2 microns. In the above diffusion step, a new oxide film 5 is formed to cover the surface of the diffused layer 4.

Figure 1D:
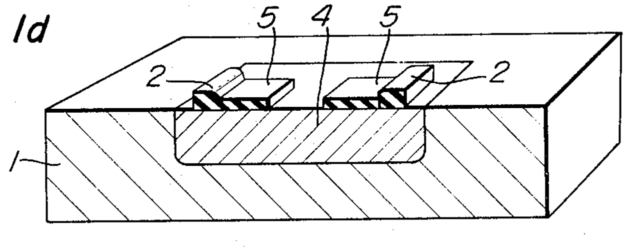
Figure 1E:
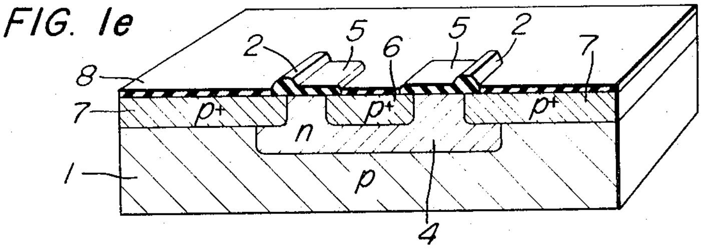

Portions of the oxide films 2 and 5 covering the principal surface of the substrate 1 are then selectively removed as shown in FIG. 1*d* to prepare for the subsequent diffusion of an acceptor impurity such, for example, as boron. The above selective removal treatment for the oxide films 2 and 5 expose a portion of the n-type diffused layer 4, a marginal portion of a pn junction formed between the diffused layer 4 and the substrate 1 and terminating at the principal surface of the substrate 1, and a portion of the principal surface of the substrate 1. A boron diffusion treatment is then performed to form p-type diffused layers 6 and 7 in the substrate 1. These p-type diffused layers 6 and 7 have an impurity concentration in the order of $10^{18}$ atoms per cubic centimeter and a depth in the order of 0.5 to 1 micron. In this respect, it is to be noted that the diffused layer 7 has a surface impurity concentration which is substantially slightly higher than $10^{19}$ atoms per cubic centimeter, while the diffused layer 6 has a surface impurity concentration in the order of $10^{18}$ atoms per cubic centimeter. As in the case of the preceding diffusion treatment, all the exposed surfaces are now covered with an oxide film 8 which has a thickness in the order of 2,000 to 3,000 A. In the step shown in FIG. 1*c*, the p-type diffused layer 6 is provided to serve as a gate region, and in this respect, is desirably formed in a continuous relation with the substrate 1 and/or the diffused layer 7. However, the provision of the diffused layer 6 in the continuous relation with the substrate 1 and/or the diffused layer 7 is in no way an indispensable requirement, because such diffused layer 6 can easily be electrically connected with the substrate 1 by a separate conducting means. Further, the diffused layer 7 is provided to serve as an anti-channel layer or an inversion preventive layer and hence is required to have a sufficiently high impurity concentration which is at least effective to prevent the surface of the substrate 1 from being inverted to the n-type by the oxide film 8. The photo-etching technique and the evaporation technique well known in the art are then applied to the structure shown in FIG. 1*c* for the deposition of required electrodes so that a junction-type field effect transistor as shown in FIG. 3 can be finally obtained.

Figure 3:
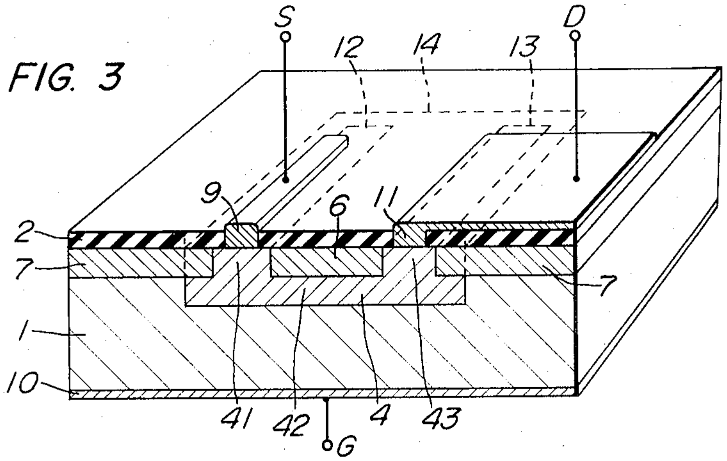
FIG. 3 is a partly sectional perspective view showing the structure of an embodiment of the junction-type field effect transistor according to the present invention.

FIG. 3 shows the structure of a semiconductor device which can be obtained by the above-described method of the present invention. In FIG. 3, the oxide films 2, 5 and 8 in FIGS. 1*a* to 1*e* are shown as a single oxide film 2 of uniform thickness for the sake of simplicity. The semiconductor device shown in FIG. 3 comprises a p-type silicon substrate 1 having a relatively low impurity concentration, hence, a high resistivity, an n-type layer 4 including therein a source region 41, a conductive channel 42 and a drain region 43, a $p^+$-type layer 6 having a low resistivity to serve as a diffused gate region, and a $p^+$-type layer 7 having a low resistivity to serve as an inversion preventive layer. A drain electrode 11 and a source electrode 12 are disposed on one surface of the semiconductor substrate 1 in an ohmic contact relation therewith, while a gate electrode 10 is disposed on the other surface of the semiconductor substrate 1 also in an ohmic contact relation therewith. Although the gate electrode 10 is disposed to lie on the other surface of the substrate 1 in FIG. 3, the gate electrode 10 may be disposed in such a manner that it extends to the high-doped $p^+$-type region 7 formed in the principal surface portion of the substrate 1 in order to reduce the gate series resistance. The principal surface of the substrate 1 is entirely covered with the oxide film 2 except those portions which are connected to the electrodes 9 and 11.

It will thus be understood that, according to the present invention, the portion where the induced surface layer has imparted the greatest influence to the electrical properties of the transistor, that is, that portion of the pn junction formed between the substrate 1 and the n-type layer 4 which is exposed on the surface of the substrate 1 as shown by a broken line 14 is entirely covered with the $p^+$-type layer 7 having a high impurity concentration substantially the same as that of the $p^+$-type layer 6 forming the gate region. By virtue of the provision of the high-doped $p^+$-type layer 7, there is utterly no possibility of the formation of an objectionable induced surface layer which extends across the source and drain regions along the semiconductor substrate surface beneath the oxide film 2. More precisely, it was found that a variation in the conductivity as well as inversion of the conduction type of the semiconductor surface portion lying directly beneath the oxide film due to the action of ions in the oxide film took place when the impurity concentration of the semiconductor surface was substantially lower than $10^{19}$ atoms per cubic centimeter, and the undesirable variation as pointed out above hardly took place when the surface impurity concentration was higher than the above-specified value. As a natural consequence, the semiconductor device having the structure as described above was quite free from any fluctuation in the gate leakage current during its operation. Further, it was possible to utterly eliminate the formation of the undesirable induced surface layer which will short-circuit the drain region to the source region in the early stage of or during its operation, with the result that the leakage current path was interrupted and the leakage current could be reduced to an extremely low value and the stability of operation could be thereby enhanced.

In the absence of such a $p^+$-type compensation region, the reverse current flowing between the gate and the source (with the source and the drain short-circuited) was 10 to 100 μa., while in case such a $p^+$-type diffused region was provided in such a manner as to surround the pn junction in a spaced relation therefrom, the reverse current was 1 to 5 mμa. It was ascertained that the reverse current could be reduced to a value less than 5 μμa. when such a $p^+$-type diffused region was formed in such a manner as to encompass the pn junction while contacting all the regions of the pn junction in accordance with the present invention. The present invention is further advantageous in its notable effect of minimizing the lowering of the breakdown voltage due to the leakage current. In the structure of the embodiment shown in FIG. 3, a problem of the lowering of the junction breakdown voltage may arise from the fact that the semiconductor surface has such a high impurity concentration. However, in view of the fact that the breakdown voltage of the junction-type field effect transistor during operation is primarily defined by the breakdown voltage of the junction between the gate region 6 and the n-type diffused region 4, no problem whatsoever in respect of the lowering of the breakdown voltage would arise in the structure of the present embodiment in which the $p^+$-type layer 7 is so formed as to have an impurity concentration substantially equal to that of the p-type gate region 6. A further advantage of the present invention resides in the fact that an additional manufacturing step is not specifically required to obtain the structure of the semiconductor device shown in FIG. 3 since the above $p^+$-type compensation region 7 can be easily formed in a simultaneous relation with the impurity diffusion to form the gate region 6.

Figure 4:
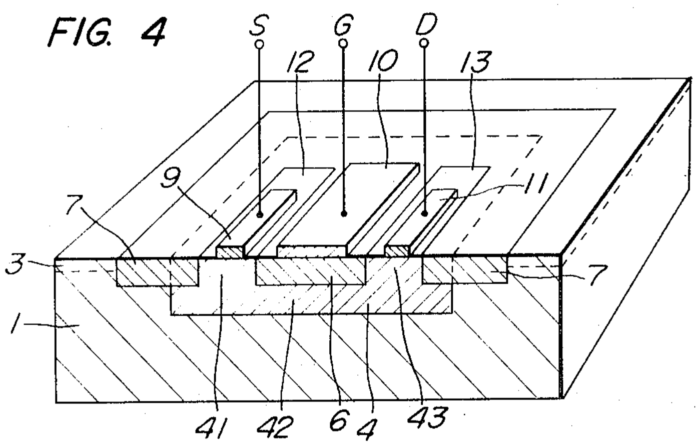
FIG. 4 is a partly sectional perspective view showing the structure of another embodiment of the junction-type field effect transistor according to the present invention.

Another embodiment shown in FIG. 4 is a modification of the transistor structure shown in FIG. 3. The transistor structure shown in FIG. 4 is generally similar to the transistor structure shown in FIG. 3 in that the former structure can also be obtained in accordance with the method shown in FIGS. 1*a* to 1*e*. However, the former structure differs from the latter structure in that the area of the $p^+$-type layer 7 is limited so that the layer 7 can only cover the pn junction formed between the n-type layer 4 and the substrate 1 and a limited portion in the vicinity of the pn junction. Therefore, the embodiments shown in FIG. 3 and FIG. 4 are structurally only different from each other in the area of the diffused layer 7. It is to be noted that the oxide film is not shown in FIG. 4 in order to clearly illustrate the structure of the transistor. With this transistor structure too, a fully pracitcal effect for example, a low leakage current and the prevention of the short-circuit between the source and the drain regions, hence a high input and a high output impedance which are the primary object of the present invention can be sufficiently attained.

Figure 2A:
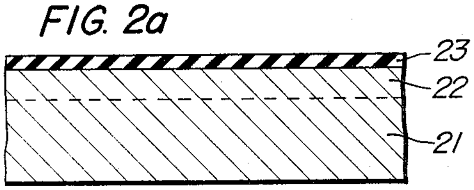
FIGS. 2*a* to 2*d* are sectional views illustrating successive steps for the manufacture of another embodiment of the junction-type field effect transistor according to the present invention.
Figure 2C:
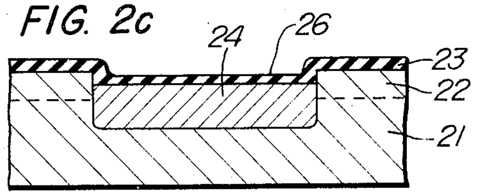
Figure 2B:
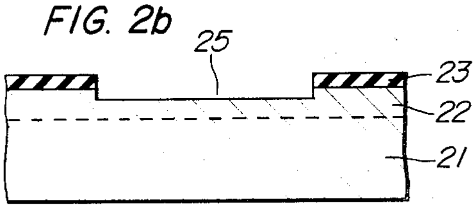
Figure 2D:
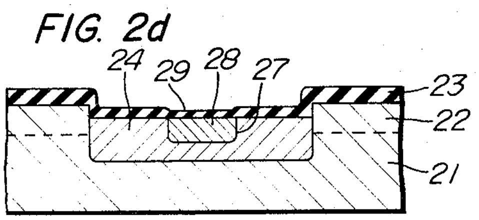

A further embodiment of the present invention is shown in FIGS. 2*a* and 2*d*. Referring to FIG. 2*a*, a single-crystalline p-type silicon substrate 21 having a resistivity of 3 Ω-cm. is first prepared, and an impurity such, for example, as boron is deposited on one of the principal surfaces of the substrate 21, the deposited boron being then diffused to provide a $p^+$-type surface layer 22 having a thickness in the order of 2 microns and an impurity concentration in the order of $4\times10^{19}$ atoms per cubic centimeter. In the above impurity diffusion step, an oxide film 23 about 6,000 A. thick is formed on the $p^+$-type surface layer 22. Then, as shown in FIG. 2*b*, a portion of the oxide film 23 is removed, and an opening 25 about 0.5 micron deep is bored through the $p^+$-type surface layer 22 by the photo-etching. This photo-etching treatment is required in order to remove a portion of the $p^+$-type surface layer 22 of high impurity concentration to thereby facilitate the succeeding diffusion of a donor impurity. In accordance with the selective diffusion technique well known in the art, a donor impurity such, for example, as antimony is diffused into the substrate 21 through the opening 25 to provide an n-type layer 24 having an impurity concentration in the order of $10^{16}$ atoms per cubic centimeter and a depth in the order of 2 microns. During the above diffusion treatment, an oxide film 26 about 3,000 A. thick is formed to cover the n-type layer 24 as shown in FIG. 2*c*. The oxide film 26 is then selectively removed to provide an opening through which an impurity such, for example, as boron is diffused to provide a gate region 28 having a surface impurity concentration in the order of $10^{18}$ atoms per cubic centimeter and a thickness in the order of 1 micron, as shown in FIG. 2*d*, and a pn junction 27 is formed between the gate region and the n-type layer. In the above diffusion step, an oxide film 29 is formed to cover the gate region 28.

In the foregoing description, a few specific embodiments of the present invention have been disclosed, but it will be apparent for anyone skilled in the art that changes and modifications may be easily made therein without departing from the scope of the appended claims. For example, the electrically insulating film covering the substrate surface may be a film of $Si_3N_4$ or a vitreous film including a specific oxide such as phosphor oxide, boron oxide and lead oxide etc., in lieu of the $SiO_2$ film referred to in the disclosure made herein. Further, the junction may be formed by the utilization of the technique of epitaxial growth well known in the art. The material forming the substrate is not limited to silicon and may be germanium or an intermetallic compound commonly employed in the art of semiconductor making.

We claim:

1. A method for manufacturing a junction-type field effect semiconductor device comprising the steps of:
   - forming on a major surface of a semiconductor substrate having a first conductivity type a first insulating film having a hole extending therethrough to said major surface;
   - forming a diffused region by diffusing a second conductivity type determining impurity into said substrate through said hole to form a PN junction between said diffused region and said substrate, said PN junction terminating at said major surface of said substrate;
   - forming a second insulating film on said substrate to cover a surface of the diffused region thereof;
   - forming an opening exposing the entire termination of the PN junction and a strip-like surface portion of said diffused region by selectively removing said first and second insulating films so as to form a pair of spaced islands of said second insulating film on the surface of said diffused region;
   - forming a heavily doped region of a first conductivity type in the substrate by diffusing the first conductivity type determining impurity through said opening into said substrate to a depth shallower than that of said diffused region;
   - connecting a first and a second electrode to a pair of surface areas of said diffused region covered with said pair of spaced islands of said second insulating film, respectively.

2. A method for making a junction type field effect transistor comprising the steps of:
   - forming in at least a portion of a major surface of a semiconductor substrate of a first conductivity type a first semiconductor region of a second conductivity type;
   - forming a second heavily-doped semiconductor region of the first conductivity type in the major surface of the substrate so as to completely surround said first region and be contiguous with said first region, whereby a PN junction terminating at the major surface is defined between said first and second regions;
   - forming a third semiconductor region of the first conductivity type in a surface portion of said first region contiguous with said second region, whereby the surface of said first region is divided into a pair of surface areas;

covering the whole major surface of said substrate with an insulating film; and forming a source and a drain electrode on said pair of surface areas of said first region through holes formed in said insulating film, respectively.

3. A method for making a junction type field effect transistor according to claim 2 wherein said first conductivity type is P type, said second conductivity type is N type, and said insulating film consists essentially of silicon oxide.

References Cited

UNITED STATES PATENTS

| | | | |
|---|---|---|---|
| 3,226,613 | 12/1965 | Haenichen | 317—234 |
| 3,378,915 | 4/1968 | Zenner | 29—577 |
| 3,586,547 | 6/1971 | Glendinning et al. | 148—175 |

L. DEWAYNE RUTLEDGE, Primary Examiner

J. M. DAVIS, Assistant Examiner

U.S. Cl. X.R.

317—235